(12) United States Patent
Bakucz

(10) Patent No.: US 11,255,999 B2
(45) Date of Patent: Feb. 22, 2022

(54) METHOD AND SYSTEM FOR OPERATING A MAGNETIC FIELD SENSOR USING ADAPTIVE FILTER TO DETECT OBJECT

(71) Applicant: Robert Bosch GmbH, Stuttgart (DE)

(72) Inventor: Peter Bakucz, Klosterlechfeld (DE)

(73) Assignee: Robert Bosch GmbH, Stuttgart (DE)

( * ) Notice: Subject to any disclaimer, the term of this patent is extended or adjusted under 35 U.S.C. 154(b) by 73 days.

(21) Appl. No.: 16/761,366

(22) PCT Filed: Oct. 30, 2018

(86) PCT No.: PCT/EP2018/079764
§ 371 (c)(1),
(2) Date: May 4, 2020

(87) PCT Pub. No.: WO2019/091834
PCT Pub. Date: May 16, 2019

(65) Prior Publication Data
US 2021/0173112 A1  Jun. 10, 2021

(30) Foreign Application Priority Data
Nov. 8, 2017  (DE) .......................... 102017219858.3

(51) Int. Cl.
*G01V 3/08* (2006.01)
*G01R 33/06* (2006.01)
*G01D 5/14* (2006.01)

(52) U.S. Cl.
CPC ............ *G01V 3/081* (2013.01); *G01D 5/145* (2013.01); *G01R 33/06* (2013.01)

(58) Field of Classification Search
CPC ........ G01D 5/145; G01R 33/06; G01V 3/081; G01V 3/10; G01V 3/101; G01V 3/104;
(Continued)

(56) References Cited

U.S. PATENT DOCUMENTS 5,761,383 A    6/1998 Engel et al.
2003/0052684 A1  3/2003 Nelson et al.
(Continued)

FOREIGN PATENT DOCUMENTS

CN    1605030 A    4/2005
CN   101110161 A   1/2008
(Continued)

OTHER PUBLICATIONS

International Search Report for PCT/EP2018/079764, dated Feb. 13, 2019.

*Primary Examiner* — Jay Patidar
(74) *Attorney, Agent, or Firm* — Norton Rose Fulbright US LLP; Gerard Messina

(57) ABSTRACT

A method for operating a magnetic field sensor and an associated magnetic field sensor system. The method includes: detecting an output signal of the magnetic field sensor that describes a magnetic field detected by the magnetic field sensor; establishing an adaptive filter function of an adaptive filter based on a model that describes an influence of specific objects on the output signal; filtering the output signal with the aid of the adaptive filter; ascertaining a deviation between the output signal and the output signal filtered with the aid of the adaptive filter; and detecting a presence of an object to be detected, based on the ascertained deviation.

9 Claims, 2 Drawing Sheets

(58) Field of Classification Search
CPC ... G01V 3/102; H03K 17/9512; H03K 17/952
See application file for complete search history.

(56) References Cited

U.S. PATENT DOCUMENTS

| | | | |
|---|---|---|---|
| 2008/0054905 A1 | 3/2008 | Linse et al. | |
| 2008/0136406 A1* | 6/2008 | Hainz | G01D 5/145 |
| | | | 324/207.25 |
| 2015/0301216 A1 | 10/2015 | Hautson et al. | |
| 2016/0282141 A1 | 9/2016 | Rajamani et al. | |
| 2017/0045337 A1 | 2/2017 | Kim | |
| 2019/0226880 A1* | 7/2019 | Raman | G01D 5/24476 |

FOREIGN PATENT DOCUMENTS

| | | | |
|---|---|---|---|
| CN | 101266717 A | 9/2008 | |
| CN | 102150060 A | 8/2011 | |
| CN | 103150929 A | 6/2013 | |
| CN | 104122895 A | 10/2014 | |
| CN | 104823026 A | 8/2015 | |
| CN | 204531551 U | 8/2015 | |
| CN | 105869434 A | 8/2016 | |
| CN | 105934787 A | 9/2016 | |
| CN | 106164700 A | 11/2016 | |
| CN | 106443524 A | 2/2017 | |
| CN | 106574972 A | 4/2017 | |
| DE | 69110399 T2 | 11/1995 | |
| DE | 102013200434 A1 | 7/2014 | |
| DE | 102015219735 A1 | 4/2017 | |
| FR | 2915838 A1 | 11/2008 | |
| WO | 2005043195 A1 | 5/2005 | |

* cited by examiner

METHOD AND SYSTEM FOR OPERATING A MAGNETIC FIELD SENSOR USING ADAPTIVE FILTER TO DETECT OBJECT

FIELD

The present invention relates to a method for operating a magnetic field sensor and to a magnetic field sensor system.

BACKGROUND INFORMATION

The design of parking spaces for parking vehicles is a present-day problem in the traffic system that has a big influence on the traffic flow and the urban landscape architecture. The endeavor to reduce the space necessary to park vehicles has resulted in that fully automated and mechanical parking systems are being developed. Such systems are, however, delimited in that these may only be provided to a limited extent due to their manufacturing and maintenance costs. It is thus desirable to provide a parking space detection system that is based on a particularly cost-effective and low-maintenance sensor technology.

The use of magnetic field sensors that are suitable for analyzing a magnetic field strength is desirable for this purpose. A signal processing that is necessary for this purpose is difficult, however, since severely non-linear problems are to be dealt with in the case of the analysis necessary for this purpose.

SUMMARY

An example method according to the present invention for operating a magnetic field sensor includes detecting an output signal of the magnetic field sensor that describes a magnetic field detected by the magnetic field sensor; establishing an adaptive filter function of an adaptive filter based on a model that describes an influence of specific objects on the output signal; filtering the output signal with the aid of the adaptive filter; ascertaining a deviation between the output signal and the output signal filtered with the aid of the adaptive filter; and detecting a presence of an object to be detected, based on the ascertained deviation.

An example magnetic field sensor system according to the present invention includes a signal processing unit that is configured to detect an output signal of a magnetic field sensor that describes a magnetic field detected by the magnetic field sensor; to establish an adaptive filter function of an adaptive filter based on a model that describes an influence of specific objects on the output signal; to filter the output signal with the aid of the adaptive filter; to ascertain a deviation between the output signal and the output signal filtered with the aid of the adaptive filter; and to detect a presence of an object to be detected, based on the ascertained deviation.

A magnetic field sensor is a sensor that is suitable for detecting an orientation and a strength of a present magnetic field. The adaptive filter function describes the filter properties of the adaptive filter. The filter properties are changeable and are established according to the present invention. This takes place based on a model that describes an influence of specific objects on the output signal. The specific objects are in this case a number of objects that have previously been established. For example, the specific objects are specific vehicle types or specific vehicle models. The adaptive filter function is preferably established in such a way that a signal portion is filtered out of the output signal which occurs in the output signal, if one of the specific objects is present. The output signal is thus filtered with the aid of the adaptive filter.

When ascertaining the deviation between the output signal and the output signal filtered with the aid of the adaptive filter, the output signal and the filtered output signal are preferably subtracted from one another. The deviation is thus in particular a difference between the output signal and the filtered output signal. This preferably takes place with the aid of an adder or a subtractor. The result is an ascertained deviation. If the adaptive filter was capable of largely filtering out of the output signal the signal form of the output signal resulting from an object to be detected, the deviation is correspondingly large. If the adaptive filter was not capable of filtering this portion out of the output signal, since the model does not describe an influence of this present object on the output signal, the deviation between the output signal and the filtered output signal is small. In this case, it may be established that there is no object to be detected in the surroundings of the magnetic field sensor.

The magnetic field sensor is therefore in particular configured to detect the previously defined specific objects, if these are present in the surroundings of the magnetic field sensor. The magnetic field sensor is in particular a magnetic field sensor that is used in a parking space detection system designed to detect free parking spots in a parking area. The magnetic field sensor system is in particular encompassed by the parking space detection system.

The example method and the example device are thus provided, in particular based on reference measurements, an adaptive structure is created, due to which an adaptive filter function is established and objects may be detected.

Preferred refinements of the present invention are described herein.

The output signal preferably describes a temporal profile of a magnetic field vector. A magnetic field vector is a vector, whose absolute value describes a strength of a present magnetic field and whose direction describes an orientation of the present magnetic field. The magnetic field vector is preferably a two-dimensional vector, particularly preferably a three-dimensional vector. The use of a two-dimensional vector may be advantageous in this case, since an orientation of a magnetic field in two dimensions is particularly easily detectable. A three dimensional vector results in a greater accuracy, however, when it comes to detecting the presence of an object to be detected.

Furthermore preferably, the adaptive filter function of the adaptive filter is further established based on an error signal, the error signal in particular corresponding to the deviation that is present, if no object to be detected is present. The error signal thus describes a baseline signal of the magnetic field sensor. The error signal is used to describe and compensate for an influence on the magnetic field sensor that results for a characteristic local magnetic field, which is generated by most different magnetic and changeable influences naturally present in the surroundings of the magnetic field sensor. In this way, such natural influences are also filtered out of the output signal with the aid of the adaptive filter and the presence of an object to be detected is detected even more reliably.

It is also advantageous when the error signal is a feedback signal that is generated based on the ascertained deviation. The feedback signal is preferably ascertained with the aid of at least one mean square filter from the signal that describes the deviation between the output signal and the filtered output signal. In this way, the system is going to autonomously adapt to the modified surrounding conditions. A particularly reliable magnetic field sensor may thus be created.

It is also advantageous when the model that describes the influence of specific objects on the output signal includes a database, in which for each of the specific objects, an associated data set is stored and the adaptive filter function is ascertained based on the at least one data set in the database, which describes the influence of the particular specific object on the output signal. A predefined number of specific objects and their associated data sets may thus be readily accessed, whereby the adaptive filter function may be readily adapted for specific objects. In particular, a data set is selected from the database to establish the adaptive filter function, the selection taking place based on the incoming output signal of the magnetic field sensor. For example, that data set may be selected, in the case of which a particularly great similarity of an influence of a specific object on the output signal may be inferred with regard to the instantaneously present output signal.

The adaptive filter function is preferably ascertained with the aid of a neural network. For example, the selection of the data set from the database takes place in particular with the aid of a neural network. Such a neural network is particularly flexibly suitable to carry out decisions when selecting the data sets based on a present output signal.

The specific objects and the objects to be detected are preferably vehicles. The system may thus be optimized to detect a presence of vehicles, whereby its use is particularly efficient in parking facility routing systems, in particular.

It is also advantageous when the model that describes the influence of specific objects on the output signal is ascertained with the aid of a measuring system and provided for the further operation of the magnetic field sensor. Here, the data sets of the database associated with the specific objects, in particular, are ascertained with the aid of the measuring system. At least one measurement is thus carried out in each case for a plurality of specific objects, in particular for a plurality of vehicle types or vehicle models, to ascertain the influence of the particular objects on the output signal. Here, a data set in particular describes a profile of the output signal in the case of different movements of the particular specific objects.

BRIEF DESCRIPTION OF THE DRAWINGS

Exemplary embodiments of the present invention are described in detail below with reference to the figures.

DETAILED DESCRIPTION OF EXAMPLE EMBODIMENTS

Figure 1:
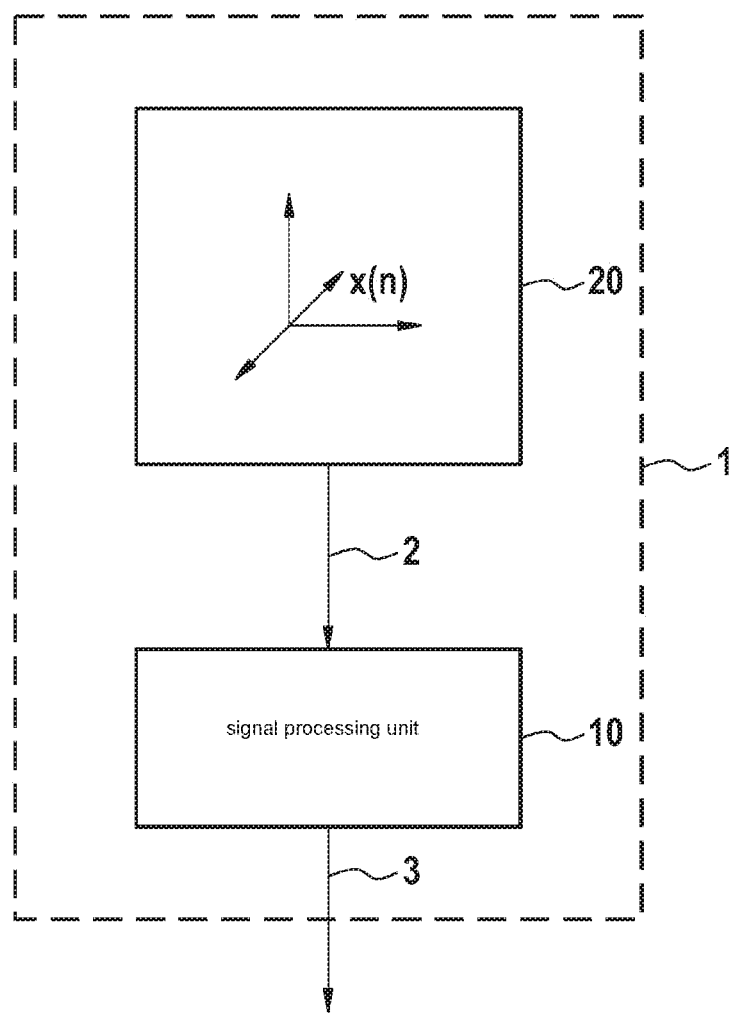
FIG. 1 shows an illustration of a magnetic field sensor system according to one exemplary specific embodiment of the present invention.

FIG. 1 shows an example magnetic field sensor system 1 in accordance with the present invention that includes a signal processing unit 10 and a magnetic field sensor 20. Magnetic field sensor system 1 is configured to carry out the example method according to the present invention for operating magnetic field sensor 20.

Magnetic field sensor system 1 is situated on a floor space of a parking facility, possible parking spots for the vehicles being present in the surroundings of magnetic field sensor 20. With the aid of magnetic field sensor system 1 it is detected, whether or not a vehicle is in fact present in the area of magnetic field sensor 20. Here, it is detected by magnetic field sensor system 1, whether a magnetic field is changing in the area of magnetic field sensor 20 as a result of a vehicle or whether the magnetic field is changing as a result of other influences.

An output signal of magnetic field sensor 20 that describes a magnetic field detected by magnetic field sensor 20 is initially detected. Magnetic field sensor 20 detects a direction and a strength of a magnetic field and outputs same as output signal 2 in the form of a magnetic field vector. The magnetic field vector has n dimensions and is therefore also referred to as x(n). Here, magnetic field vectors that are detected continuously in a temporal sequence are output. Every 10 seconds, a new magnetic field vector is, for example, detected and output by magnetic field sensor 20.

Figure 2:
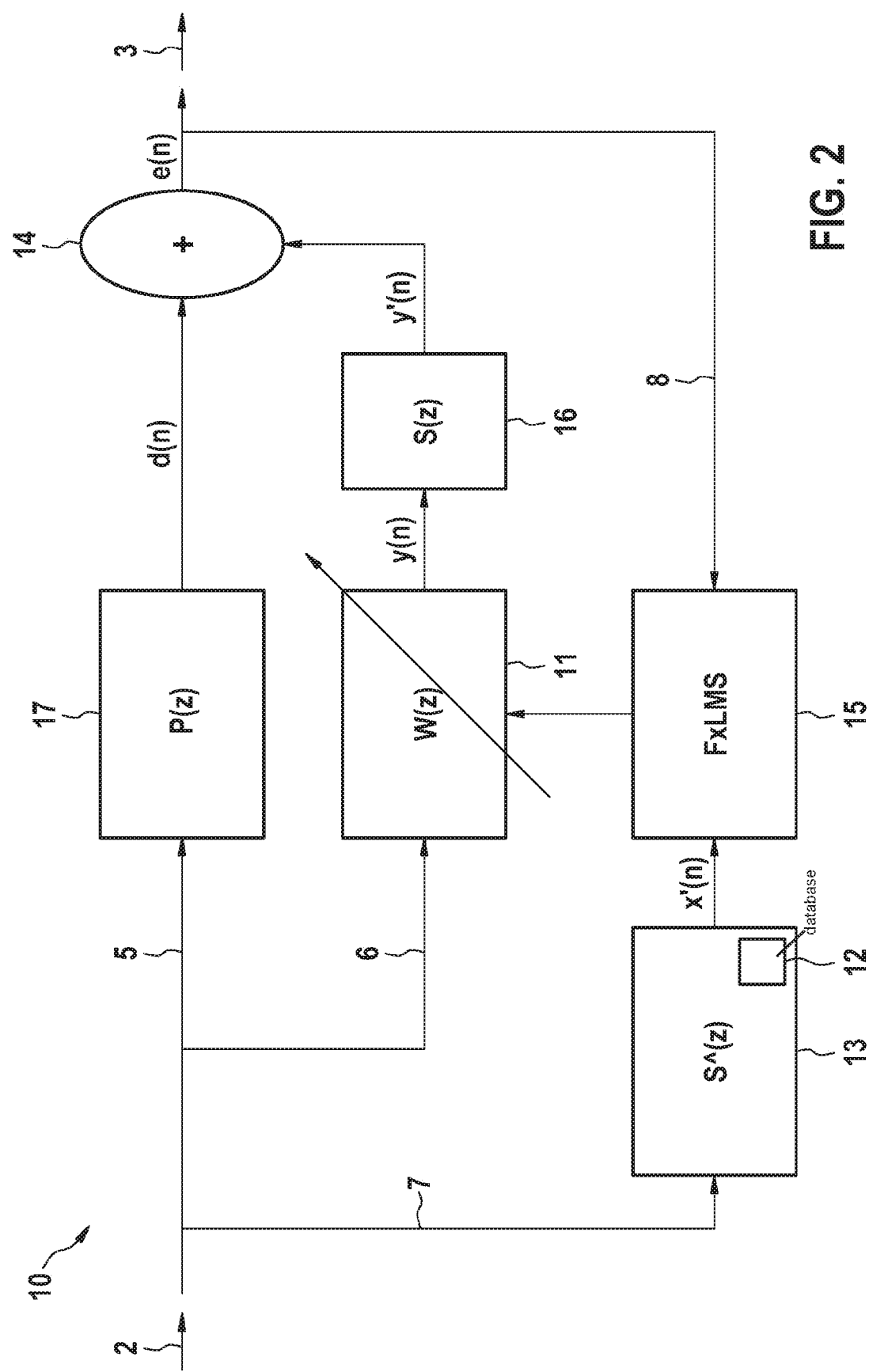
FIG. 2 shows a signal flow chart of a signal processing unit of the exemplary magnetic field sensor system.

Output signal 2, which is output by magnetic field sensor 20, is detected by signal processing unit 10. A signal flow chart of signal processing unit 10 is illustrated in FIG. 2. Output signal 2 is provided to signal processing unit 10 on the input side (left-hand side in FIG. 2), and thus detected by same. Output signal 2 is guided in parallel via a primary path 5 and a secondary path 6. Secondary path 6 includes an adaptive filter 11. At the end of primary path 5 and at the end of secondary path 6, both are coupled through an adder 14. An output of adder 14 simultaneously forms an output of signal processing unit 10. An error signal, which is also referred to as e(n), is output here.

It is thus apparent that output signal 2 is guided via primary path 5 from an input side via adder 14 directly to an output side of signal processing unit 10. Secondary path 6 is used to tap output signal 2 filtered through filter 11 to subsequently be subtracted from output signal 2 guided via primary path 5. The subtraction takes place with the aid of adder 14. For this purpose, adder 14 includes additional elements, such as inverters, for example, to make a subtraction possible.

It is pointed out that primary path 5 and secondary path 6 may include six other filter elements. Blocks 16, 17 represent the state of output signal 2 on the two paths, i.e., on primary path 5 and on secondary path 6. Here, a signal state is represented on the primary path as P(z) and the signal state downstream from the adaptive filter is represented on secondary path 6 as S(z).

P(z) describes in this case a primary transfer function of primary path 5 between the input side of signal processing unit 10, at which output signal 2 is applied, and the output side of signal processing unit 10, at which error signal e(n) is output. S(z) is a secondary transfer function of secondary path 6 that is provided in addition to the transfer function of adaptive filter 11. Adaptive filter 11 is an active noise filter among other things. Output signal 2 is a temporal profile of a magnetic field vector. Output signal 2 is filtered on secondary path 6 with the aid of adaptive filter 11.

It is further apparent from FIG. 2 that signal processing unit 10 includes a further path 7 that includes a neural network 13. The adaptive filter function of adaptive filter 11 is ascertained and established with the aid of neural network 13. For this purpose, neural network 13 includes a database 12. Database 12 includes multiple inputs for different specific objects. In this described specific embodiment, the specific objects are vehicle types. A data set is stored in database 12 for each vehicle type. For the specific vehicle type, the data set describes a signal form of output signal 2 that results when a vehicle of the particular vehicle type approaches magnetic field sensor 20.

If a vehicle approaches magnetic field sensor system 1 described here, output signal 2 is transferred from magnetic field sensor 20 to signal processing unit 10 and provided there to neural network 13. Neural network 13 ascertains in database 12 an input that describes preferably precisely instantaneously present output signal 2. Based on this input of database 12, i.e., on the best suitable data set of a vehicle type, the adaptive filter function of adaptive filter 11 is established. Actually present output signal 2 of magnetic field sensor 20 is thus remodeled by neural network 13 and associated database 12 and put into adaptive filter 11 as a signal form to be filtered. A counter vector x'(n), which is modeled based on the previously provided inputs of database 12, is thus modeled to magnetic field vector x(n). Together with neural network 13, database 12 thus forms a model that describes an influence of specific objects on output signal 2.

A scenario is now described, in which a vehicle approaches magnetic field sensor 20. It is assumed that a data set is present in database 12 for the vehicle type of this vehicle. Since the vehicle is approaching magnetic field sensor 20, output signal 2 includes an associated signal form. In this case, the data set selected by neural network 13 will describe this signal form with great similarity. The filter function of adaptive filter 11 is used by neural network 13 in such a way that the change of output signal 2 caused by the vehicle is nearly filtered out of output signal 2 on secondary path 6. Essential components are thus filtered out of output signal 2 by adaptive filter 11. The result therefore is that a signal d(n) at the end of primary signal path 5 and a signal y'(n) at the end of secondary signal path 6 have a great deviation 3 from one another, since essential portions have been filtered out of output signal 2 by adaptive filter 11 on secondary path 6. This deviation 3 between output signal 2 and output signal 2 filtered with the aid of adaptive filter 11 is ascertained by adder 14. If this deviation is great, for example equal to value 1, it is established that an object to be detected is present in the surroundings of magnetic field sensor 20. For this purpose, deviation 3 is compared to a threshold value, for example.

It is now assumed that no vehicle is present in the surroundings of magnetic field sensor 20. However, other movements in the surroundings of magnetic field sensor 20 have a certain influence on magnetic field sensor 20 and thus on output signal 2. In this scenario, output signal 2 is also provided to neural network 13. In this case, the latter will also select a preferably similar signal form from database 12 and correspondingly establish the adaptive filter. However, since the signal form in output signal 2 is not caused by a vehicle, adaptive filter 11 will, however, filter out few portions from output signal 2. The filter function is thus not optimally selected for present output signal 2. Adaptive filter 11 thus has less influence on signal y'(n), which is output at the end of secondary path 6 to adder 14, as compared to the case in which a vehicle is present in the surroundings of magnetic field sensor 20. Adder 14 thus subtracts almost identical signals from one another and outputs a minor deviation 3. If this deviation 3 is below the threshold value, it is detected that no object to be detected, no vehicle to be detected in this case, is present in the surroundings of magnetic field sensor 20.

Magnetic field sensor 20 and associated magnetic field sensor system 1 are thus suited to detect particularly effectively the presence of such objects that are to be detected and are established as specific objects in the model, for example since a data set is stored for these in database 12. In other words, this means that magnetic field sensor system 1 is optimized for detecting and recognizing the specific objects.

As is also shown in FIG. 2, signal processing unit 10 additionally includes a feedback path 8, via which a feedback signal is provided that corresponds to error signal e(n). The feedback signal is tapped from the output of signal processing unit 10, the output of adder 14 in this case, and is thus a function of ascertained deviation 3.

The adaptive filter function of adaptive filter 11 is preferably further established based on error signal e(n), i.e., based on deviation 3, error signal e(n) in particular corresponding to deviation 3 that is present, if no object to be detected is present. For this purpose, an output signal of signal processing unit 10 is provided via feedback path 8 to a least mean square filter 15. With the aid of the latter, the adaptive filter function of adaptive filter 11 is defined even more precisely. In this way, the transfer functions of primary path 5 and of secondary path 6 are adapted to one another. An influence of local conditions on the magnetic field sensor system may thus be compensated for.

It is assumed that no vehicle is present in the proximity of magnetic field sensor 20. In this case, the filter function of adaptive filter 11 may be adapted based on the feedback signal, i.e., on error signal e(n), in this way until error signal e(n) and thus deviation 3 have the value zero.

Primary path 5 preferably includes a deceleration unit, due to which output signal 2 is decelerated prior to being provided to adder 14. In this way, neural network 13 is provided with a sufficient amount of time to make the filter function of adaptive filter 11 available. Furthermore preferably, such a deceleration unit is also provided on secondary path 6. Primary path 5 and secondary path 6 may also use a joint deceleration unit.

According to the present invention, a counter vector x'(n) is thus generated for each of the magnetic field vectors provided by magnetic field sensor 20, in that an adaptive filtering takes place. Deviation 3 is used to provide an error function e(n), due to which a presence or an absence of a parking facility, i.e., a presence or an absence of a vehicle, is detected. Function P(z) is a transmission function or a transfer function of primary path 5. The transmission function of entire secondary path 6 results from multiplying function S(z) by adaptive filter function W(z). For error signal e(n) and thus for deviation 3, the following results:

$$e(z)=[P(z)-S(z)W(z)]\times(n)$$

The result for the error function is thus e(z)=0, if no vehicle is present, and e(z)=1, if a vehicle is present.

In this case, secondary path 6 must be a preferably precise imitation of the signal properties of primary path 5. Thus the following applies:

$$W(z)=P(z)/S(z).$$

The advantage of magnetic field sensor system 1 according to the present invention or of the method according to the present invention is, inter alia, also that such a system may be used directly in any arbitrary surroundings, without it being necessary to further adapt the system. However, the performance of the system greatly depends on the transfer function of secondary path 6.

In addition to the above disclosure, reference is explicitly made to the disclosures of FIGS. 1 and 2.

What is claimed is:
1. A method for operating a magnetic field sensor, comprising the following steps:

detecting an output signal of the magnetic field sensor that describes a magnetic field detected by the magnetic field sensor;

establishing an adaptive filter function of an adaptive filter based on a model that describes an influence of specific objects on the output signal;

filtering out a signal portion of the output signal using the adaptive filter;

ascertaining a deviation between the output signal and the output signal filtered using the adaptive filter; and detecting a presence of an object to be detected of the specific objects, based on the ascertained deviation.

2. The method as recited in claim 1, wherein the output signal describes a temporal profile of a magnetic field vector.

3. The method as recited in claim 1, wherein the adaptive filter function of the adaptive filter is further established based on an error signal, the error signal corresponding to the deviation that is present when no object to be detected is present.

4. The method as recited in claim 3, wherein the error signal is a feedback signal that is generated based on the ascertained deviation.

5. The method as recited in claim 1, wherein the model that describes the influence of specific objects on the output signal includes a database, in which for each of the specific objects, an associated data set is stored and the adaptive filter function is ascertained based on the at least one data set in the database, which describes the influence of the specific object on the output signal.

6. The method as recited in claim 1, wherein the adaptive filter function is ascertained using a neural network.

7. The method as recited in claim 1, wherein the specific objects and the object to be detected are vehicles.

8. The method as recited in claim 1, wherein the model that describes the influence of specific objects on the output signal is ascertained using a measuring system and provided for further operation of the magnetic field sensor.

9. A magnetic field sensor system, including a signal processing unit that is configured to:

detect an output signal of a magnetic field sensor that describes a magnetic field detected by the magnetic field sensor;

establish an adaptive filter function of an adaptive filter based on a model that describes an influence of specific objects on the output signal;

filter out a signal portion of the output signal using the adaptive filter;

ascertain a deviation between the output signal and the output signal filtered using the adaptive filter; and detect a presence of an object to be detected of the specific objects, based on the ascertained deviation.

\* \* \* \* \*